United States Patent [19]
Ban et al.

[11] Patent Number: 5,904,861
[45] Date of Patent: May 18, 1999

[54] SUPERCONDUCTIVE DEVICE MANUFACTURING METHOD

[75] Inventors: Masahito Ban, Kanagawa-Ken; Tsuyoshi Takenaka, Hyogo-Ken; Katsumi Suzuki; Youichi Enomoto, both of Tokyo-To, all of Japan

[73] Assignees: International Superconductivity Technology Center, Tokyo; Kawasaki Jukogyo Kabushiki Kaisha, Kobe; NEC Corporation, Tokyo, all of Japan

[21] Appl. No.: 08/622,301

[22] Filed: Mar. 25, 1996

[30] Foreign Application Priority Data

Mar. 27, 1995 [JP] Japan ................................. 7-068230

[51] Int. Cl.$^6$ ......................................... C23F 1/00
[52] U.S. Cl. ............................... 216/67; 438/798
[58] Field of Search ................... 216/18, 67, 75, 216/79; 156/345, 643, 643.1; 438/798

[56] References Cited

U.S. PATENT DOCUMENTS

| | | | |
|---|---|---|---|
| 4,333,793 | 6/1982 | Litshitz et al. | 156/643 |
| 5,326,746 | 7/1994 | Ohtani et al. | 505/330 |
| 5,374,613 | 12/1994 | Noda et al. | 505/477 |
| 5,470,791 | 11/1995 | Suguro et al. | 437/192 |
| 5,514,247 | 5/1996 | Shan et al. | 156/643.1 |

OTHER PUBLICATIONS

Proceedings of the 5th International Symposium On Superconductivity (ISS'92), Nov. 16–19, 1992, Kobe, "Characteristics of Thin Film YBCO Micro–Stripline Resonator by Laser Etching", Tsuyoshi Takenaka et al., pp. 1147–1150.

Hiroshi Sato et al., *Jpn. J. Appln. Phys.*, Part 2, No. 8A, vol. 31, (1992) "Liquid–Nitrogen–Cooled Dry Etching of YBaCuO Thin Films", pp. L 1044–L 1046.

Roland Barth et al., *Appl. Phys. Lett. 63*, (8), (1993), "Optimization of $YBa_2Cu_3O_{7-\delta}$ submicrometer structure fabrication", pp. 1149–1151.

*Primary Examiner*—John L. Goodrow
*Attorney, Agent, or Firm*—Oliff & Berridge, PLC

[57] ABSTRACT

A superconductive device manufacturing method is disclosed, which can prevent the characteristic deterioration on the processed surface, reduce the number of process steps, and thereby shorten the manufacturing time. The superconductive device manufacturing method comprises the steps of: forming a YBCO film (301) on a substrate (201); forming a mask pattern (302) on the formed YBCO film (301); and etching the YBCO film (301) by use of the formed mask pattern (302) and a plasma including at least oxygen plasma.

13 Claims, 14 Drawing Sheets

SUPERCONDUCTIVE DEVICE MANUFACTURING METHOD

BACKGROUND OF THE INVENTION

1. Field of the Invention

The present invention relates to a superconductive device manufacturing method, and more specifically to a method of manufacturing a superconductive device by use of a plasma etching process.

2. Description of the Prior Art

As the etching method adopted to process a YBCO superconductive thin film of a superconductive device, various etching methods are so far well known, such as wet etching, laser etching, dry etching, focused ion beam etching, etc.

Here, a method of processing a YBCO superconductive thin film by use of dry etching is disclosed in Hiroshi Sato, Hiroshi Akoh, Keirou Nishimura, Masahiro Aoyagi and Susumu Takada; Journal of Japan Applied Physics Society, 31, (1992) L1044, for instance. In this processing method, as shown in FIG. 11, after Ar gas has been introduced into an ECR (electron cyclotron resonance) chamber 1101, an ECR plasma is generated by use of a microwave, and an Ar ion beam is extracted from the generated ECR plasma into an etching chamber 1102. Further, by use of the extracted Ar ion beam, the YBCO superconductive thin film formed on a sample 1104 held by a sample holder 1103 is etched. In this Paper, the acceleration voltage of the Ar ions is 240 V, and the ion current density is 0.15 mA/cm$^2$. Further, as an etching mask, an ordinary photoresist is used.

Here, when the YBCO superconductive thin film is being etched, the temperature on the processed surface rises locally. Therefore, oxygen is inevitably desorbed from the processed surface, so that the superconductivity characteristics deteriorate. To overcome this problem, in this instrument as shown in FIG. 11, the sample 1104 is cooled by use of liquid nitrogen; that is, the sample temperature is reduced to 77 K during etching to suppress the desorption of oxygen.

FIG. 12 shows an evaluation result of the relationship between the sample temperature during etching and the superconductivity characteristics. In more detail, FIG. 12 shows the relationship between a line width W ($\mu$m) (on the abscissa) obtained by patterning the YBCO superconductive thin film into a line shape and the critical current density Jc (A/cm$^2$) (on the ordinate), in which circular marks denote the values obtained when the sample 1104 is cooled down to 77 K by liquid nitrogen, and triangular marks denote the values obtained when the sample is cooled to 5° C. by water. FIG. 12 indicates that the superconductivity characteristics are excellent when the sample 1104 is cooled down to 77 K by liquid nitrogen, as compared with when cooled to 5° C. by water.

Further, another method of processing the YBCO superconductive thin film by use of dry etching is disclosed in Roland Barth, Bernd Spangenberg, Christian Jaekel, Hartmut G, Roskos, and Heinrich Kurz; Applied. Physics. Lett. 63, (1993) 1149, for instance. In this processing method, first a PMMA film is patterned by use of EBL (electron beam lithography); secondly a Ti film is patterned by RIE (reactive ion etching) with this PMMA film as a pattern mask; and the YBCO superconductive thin film is etched by sputtering Ar and oxygen ions with this Ti film as a mask (the acceleration voltage is 420 V and the sample temperature is 77 K). Further, after etching, the thin film is plasma-oxidized by use of an oxygen plasma, to restore oxygen desorbed from the processed surface during etching.

FIG. 13 is a graphical representation showing the comparison results of the superconductivity characteristics between before plasma oxidization and after plasma oxidization with respect to the line widths W of the YBCO superconductive thin film bridge (length: 10 $\mu$m). FIG. 13 indicates that when the plasma oxidization is made, the superconductivity characteristics of the bridge with a line width of 0.4 $\mu$m can be increased by about one order of magnitude, as compared with omission of plasma oxidization.

On the other hand, in the case where the superconductive device is a superconductive high frequency device, as the method of processing the YBCO superconductive thin film, an ion beam etching method using photolithography and a laser etching method are both so far well known.

The processing methods by use of these etchings are disclosed in Tsuyoshi Takenaka, Shuichi Fujino, Keiich Yamaguchi, Kunihiro Hayashi, and Katsumi Suzuki; Proceedings of 5th International Symposium on Superconductivity, Nov. 16–19, 1992, Kobe, Japan, for instance.

In this paper, after the YBCO superconductive thin film is formed on a MgO substrate with a thickness of 0.5 mm, this YBCO superconductive thin film is processed by etching, to manufacture a microstrip line resonator of 13.5 GHz. Further, this paper compares the characteristics of the resonator between when an ion beam etching using a photoresist is adopted and when a direct KrF excimer laser etching (without use of any photoresist) is adopted.

FIG. 14 is a graphical representation showing the relationship between the unloaded Q value of the resonator and the temperature obtained on the basis of the experiments, in which circular marks denote the values obtained when the ion beam etching method is adopted and cross marks denote the values obtained when the laser etching is adopted. FIG. 14 indicates that the dependency of the unloaded Q value upon the temperature is almost the same between the two cases. Therefore, this indicates that the laser etching method is advantageous to manufacture the superconductive high frequency device, because the photoresist process is not required.

As described above, when the YBCO superconductive thin film is etched, it is necessary to eliminate such a disadvantage that oxygen is desorbed from the etched surface due to a temperature rise, because the superconductivity characteristics deteriorate. Therefore, conventionally, in order to prevent oxygen from being desorbed from the etched surface, that is, to prevent the deterioration of the superconductivity characteristics, the sample is cooled by use of liquid nitrogen, or else oxygen is supplied to the etched surface by plasma oxidization after etching.

In the method of cooling the sample by use of liquid nitrogen, however, since the sample is cooled to 77 K by the liquid nitrogen and then heated to room temperature after etching, there exists a problem in that a long manufacturing time is inevitably needed.

Further, in the method of supplying oxygen onto the etched surface by plasma oxidization after etching, since an additional process is also required, there exists the similar problem in that the number of the manufacturing processes increases.

In addition, in these prior art methods, as understood with reference to FIGS. 12 and 13, although it is possible to prevent the deterioration of the superconductivity characteristics with respect to a wide pattern line formed by the etching, when the line having a width as narrow as several μm or less is etched, the superconductivity deteriorates inevitably at an edge of the narrow line, so that a sufficient effect cannot be obtained.

In particular, in the case of the superconductive high frequency device, since the current is generally concentrated at the edge of the line, the quality of the line edge exerts a serious influence upon the device characteristics. Therefore, there exists a strong need of preventing oxygen desorption perfectly during etching process. For instance, in the above-mentioned Paper related to laser etching (Proceedings of 5th International Symposium on Superconductivity, Nov. 16–19, 1992, Kobe, Japan), it is disclosed that the melted YBCO with a width of 1 μm and a height of 1 μm is laminated on the line edge. In this case, it is apparent that the melted YBCO exerts a harmful influence upon the device characteristics.

SUMMARY OF THE INVENTION

With these problems in mind, therefore, it is the object of the present invention to provide a superconductive device manufacturing method which can prevent the device characteristics from deteriorating on the processed surface, while reducing the number of process steps and the manufacturing time.

To achieve the above-mentioned object, the present invention provides a superconductive device manufacturing method comprising the steps of: forming a superconductive film on a substrate; forming a mask pattern on the superconductive film; and etching the superconductive film by use of the formed mask pattern and a plasma including at least oxygen plasma.

Here, in the etching process, the substrate temperature is kept between 0 and −10° C. Further, in the etching process, ion acceleration voltage is 200 to 500 volts, and ion current density is 4 mA/cm$^2$ or less. Further, in the etching process, the plasma is any one of argon-oxygen mixed plasma and an oxygen plasma.

Further, when a photoresist is used as a mask substance for the superconductive film in the mask pattern forming process, it is preferable to use a plasma having an oxygen mixture ratio less than 5% as the plasma in the etching process. Further, when a metal is used as a mask substance for the superconductive film in the mask pattern forming process, it is preferable to use a plasma having an oxygen mixture ratio of more than 5% as the plasma in the etching process.

DETAILED DESCRIPTION OF THE PREFERRED EMBODIMENTS

Some embodiments of the superconductive device manufacturing method according to the present invention will be described hereinbelow with reference to FIGS. 1 to 10.

Figure 1:
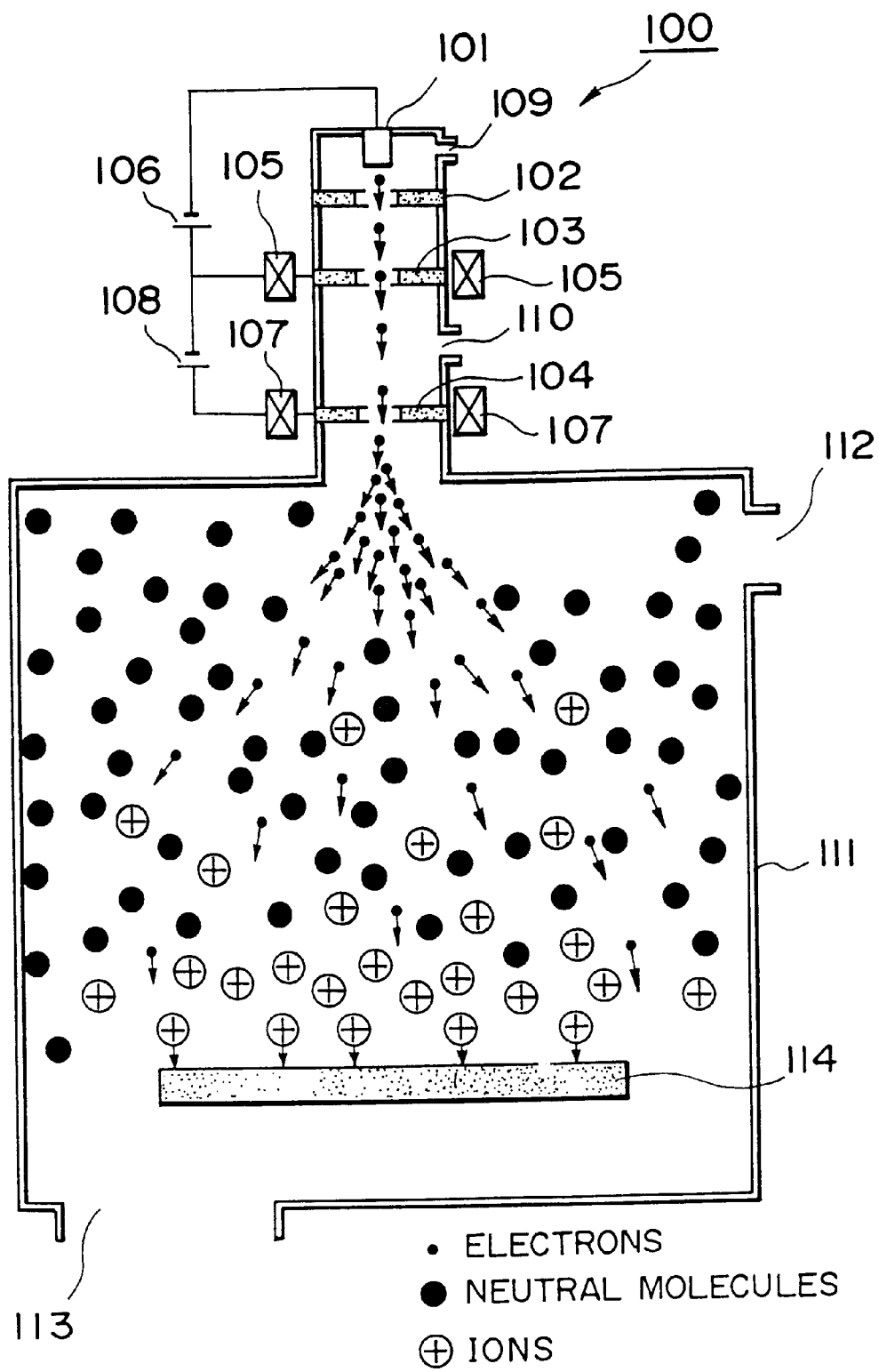
FIG. 1 is a cross-sectional view showing an electron beam excitation type plasma etching instrument used for an embodiment of the superconductive device manufacturing method according to the present invention.

FIG. 1 is a cross-sectional view showing an electron beam excitation type plasma etching instrument used for the superconductive device manufacturing method according to the present invention.

In FIG. 1, within an electron beam generating section 100, a cathode 101, an auxiliary electrode 102, a discharge electrode 103, and an acceleration electrode 104 are arranged. The discharge electrode 103 is connected to a dc discharge power supply 106. Further, the acceleration electrode 104 is connected to an acceleration power supply 108. Further, on the side surface of the electron beam generating section 100, an inlet port 109 for introducing Ar gas and an outlet port 110 for exhausting the same Ar gas are formed.

A chamber 111 is formed with an inlet port 112 for introducing a plasma generating gas (e.g., Ar-oxygen mixture gas, or an oxygen gas) and an outlet port 113 for exhausting the same introduced gas.

In the plasma etching instrument as described above, the Ar gas introduced through the inlet port 109 is ionized by the discharge electrode 103; electrons in the Ar discharge are accelerated to an optimum energy for ionization of the plasma gas by the use of the acceleration electrode 104; changed into an electron beam by the coils 105 and 107; and then introduced into the chamber 111. Therefore, when the plasma forming gas is ionized by the introduced electron beam, it is possible to form an Ar-oxygen mixture plasma or an oxygen plasma.

Further, a substrate 114 is placed in the chamber 111, and the placed substrate 114 is biased to a negative voltage. Therefore, when ions of the plasma are accelerated and then brought into collision against the surface of the substrate 114, it is possible to etch the sample formed on the surface of the substrate 114.

Figure 2:
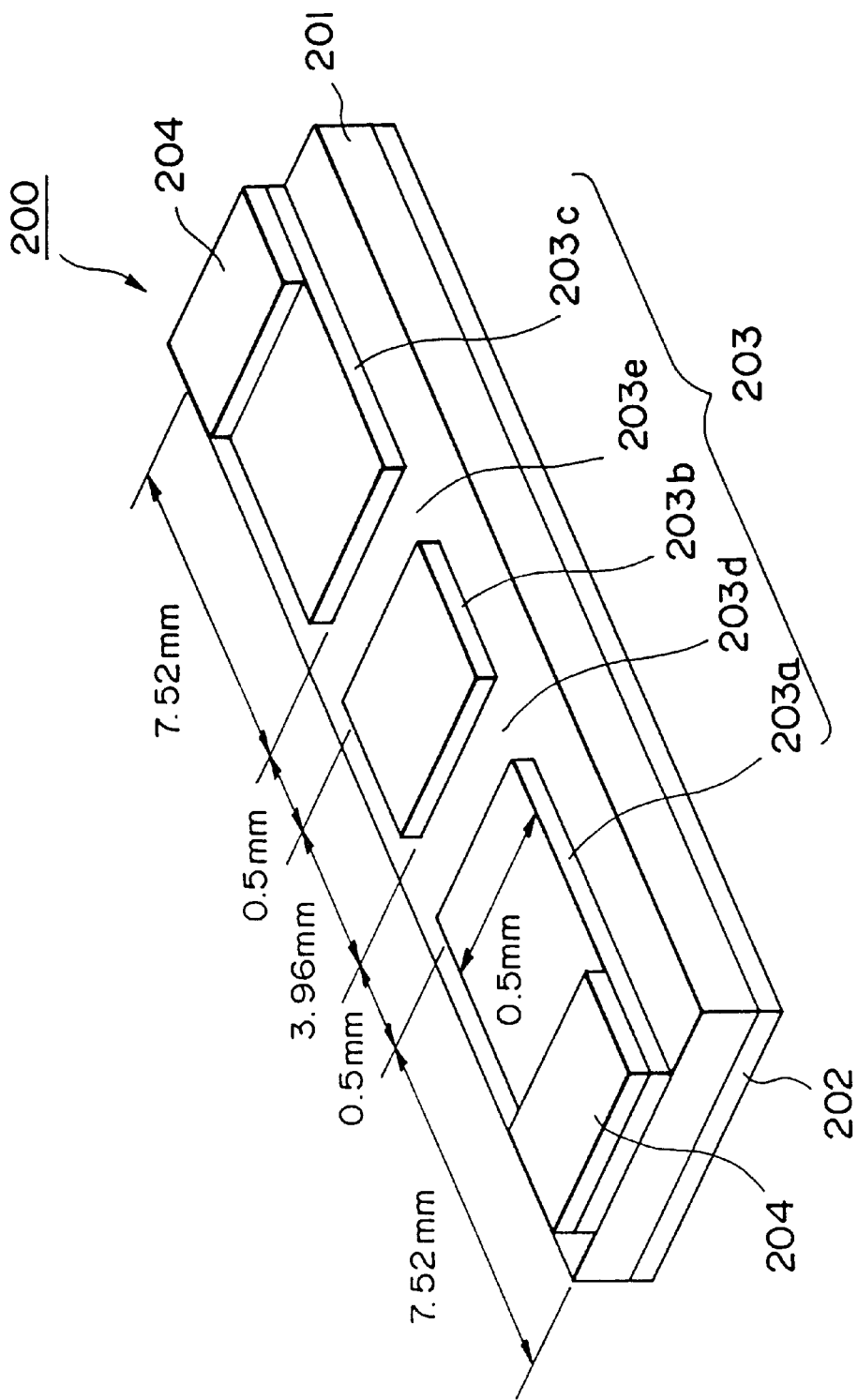
FIG. 2 is a perspective view showing a microstrip line resonator manufactured by the embodiment of the manufacturing method according to the present invention.

FIG. 2 is a perspective view showing a microstrip line resonator 200 manufactured by the method according to the present invention. Here, this microstrip line resonator 200 is so designed as to be resonated at a frequency of 13.5 GHz.

In FIG. 2, a ground plane 202 formed of Au and having a thickness of 3 μm is formed on the lower surface of the MgO <100> substrate 201 having a thickness of 0.5 mm. Further, on the upper surface of this MgO <100> substrate 201, a YBCO oxide superconductor 203 having a thickness of 350 nm, a width of 0.5 mm, and a length of 20 mm is formed. In this YBCO oxide superconductor 203, two 0.5-mm wide grooves 203d and 203e are formed at two positions 7.52 mm inward away from both ends thereof, respectively. Therefore, the YBCO oxide superconductor 203 is divided into an about 3.96-mm long middle YBCO film 203b, and two about 7.52-mm long YBCO films 203a and 203c arranged on both sides of the middle film 203b, respectively. Further, an Au electrode 204 is formed on each surface of the YBCO films 203a and 203c, respectively.

The method of manufacturing the microstrip line resonator 200 shown in FIG. 2 will be described hereinbelow. Here, the manufacturing method is explained being divided into two cases where a plasma having an oxygen mixture ratio less than 5% is used for plasma etching and a plasma having an oxygen mixture ratio more than 5% is used for plasma etching.

First, the case where the resonator 200 is manufactured by use of the plasma having an oxygen mixture ratio less than 5% will be explained with reference to FIGS. 3(a) to 3(e).

Figure 3A:
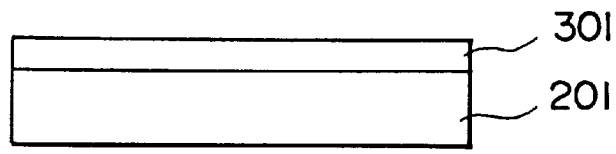
FIGS. 3(a) to 3(e) are cross-sectional views for assistance in explaining a first embodiment of the manufacturing method according to the present invention.

(1) First, as shown in FIG. 3(a), a YBCO film 301 having a thickness of 350 nm was formed on the MgO <100> substrate 201 in accordance with a pulse laser deposition method by use of a $YBa_2Cu_3O_{7-x}$ target and a KrF excimer laser. In this case, the temperature of the substrate 201 was 750° C. and the oxygen pressure was 200 mTorr.

Figure 3B:
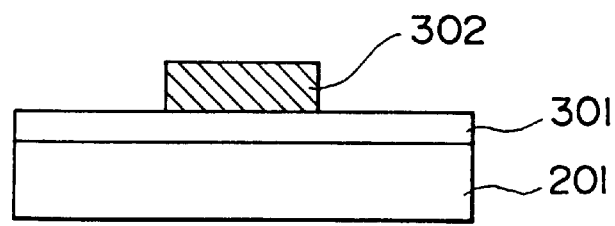

(2) Secondly, as shown in FIG. 3(b), on the surface of this YBCO film 301, an OMR 83 having a thickness of 1.4 μm was applied as a negative photoresist mask 302, and the mask 302 was patterned into a microstrip line shape in accordance with photolithography.

Figure 3C:
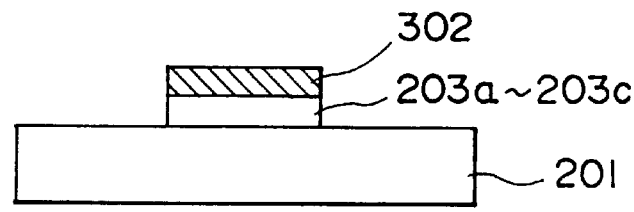

(3) Successively, as shown in FIG. 3(c), the substrate 201 was carried into the plasma etching instrument as shown in FIG. 1. After the substrate 201 had been cooled to -2° C., the substrate 201 was plasma-etched by using the photoresist mask 302 as a mask, to form the YBCO films 203a, 203b and 203c. In this case, as the plasma, an argon-oxygen mixed plasma having an oxygen mixture ratio of 5% was used. Further, the etching conditions were as follows: the plasma pressure was 0.5 mTorr; the ion acceleration voltage was 500 V; and the ion current density was 3.5 mA/cm².

Figure 3D:
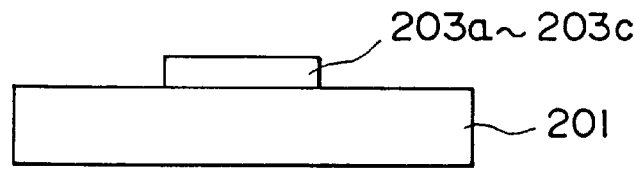

(4) Further, as shown in FIG. 3(d), after etching, the substrate 201 was heated to room temperature, and then carried out of the plasma etching instrument. Further, the negative photoresist mask 302 was removed by ashing.

Figure 3E:
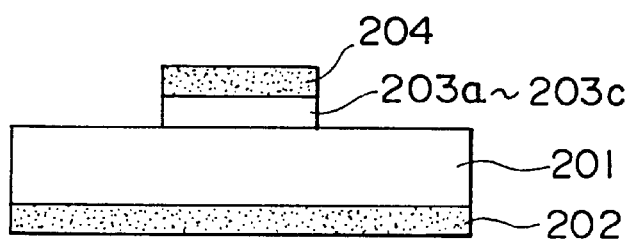

(5) Finally, as shown in FIG. 3(e), the two Au electrodes 204 having a thickness of 2 μm were formed on the surfaces of the two YBCO films 203a and 203c in accordance with an ordinary sputtering technique, and further the Au ground plane 202 having a thickness of 3 μm was formed on the lower surface of the substrate 201, thus completing the manufacturing process.

Figure 4:
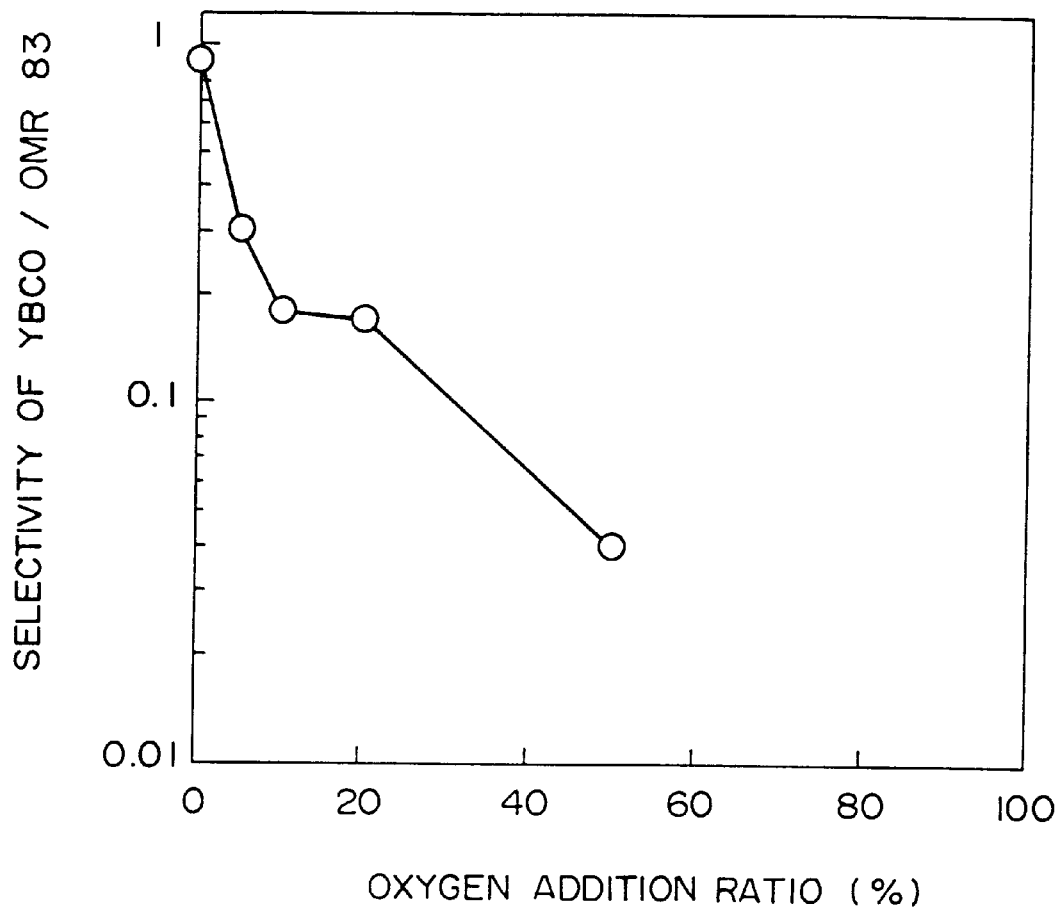
FIG. 4 is a graphical representation showing the relationship between the oxygen mixture ratio of plasma and the etching selectivity in the etching process shown in FIG. 3(c)

As described above, when the resonator 200 is manufactured by use of the plasma having an oxygen mixture ratio less than 5%, it is desirable to use the photoresist (the negative photoresist mask 302 in this embodiment). This is because when the oxygen mixture ratio is more than 5%, the etching selectivity decreases. FIG. 4 shows the relationship between the oxygen mixture ratio of the plasma and the etching selectivity. FIG. 4 indicates that when the oxygen mixture ratio of the plasma exceeds 5%, the etching selectivity decreases sharply.

Next, the case where the resonator 200 is manufactured by use of the plasma having an oxygen mixture ratio more than 5% will be explained with reference to FIGS. 5(a) to 5(e) and FIGS. 6(a) to 6(d).

Figure 5A:
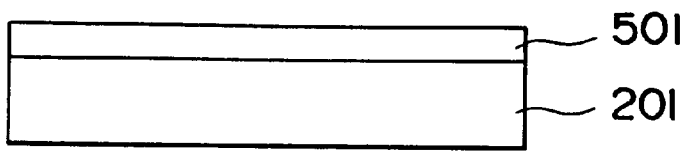
FIGS. 5(a) to 5(e) are cross-sectional views for assistance in explaining a second embodiment of the manufacturing method according to the present invention.

(1) First, as shown in FIG. 5(a), a YBCO film 501 having a thickness of 350 nm was formed on the MgO <100> substrate 201 in accordance with a pulse laser deposition method by use of a $YBa_2Cu_3O_{7-x}$ target and a KrF excimer laser. In this case, the temperature of the substrate 201 was 750° C. and the oxygen pressure was 200 mTorr.

Figure 5B:
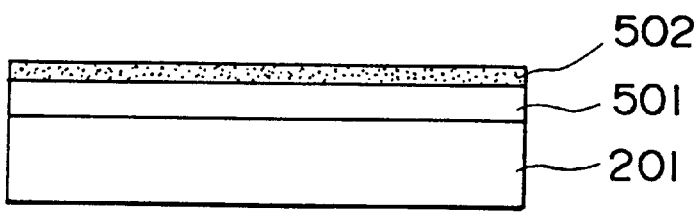
Figure 5C:
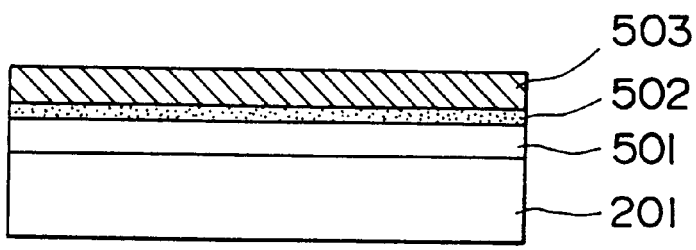

(2) Secondly, as shown in FIG. 5(b), on the surface of this YBCO film 501, an Au film 502 having a thickness of 50 nm was formed. Further, as shown in FIG. 5(c), on the surface of this Au film 502, a Nb film 503 having a thickness of 500 nm was formed in accordance with an ordinary sputtering technique. Here, the Au film 502 so formed between the YBCO film 501 and the Nb film 503 is that when the Nb film 503 is formed directly on the YBCO film 502, oxygen in the YBCO film 501 is easily deoxidized by Nb, because the desorption rate of oxygen increases.

Figure 5D:
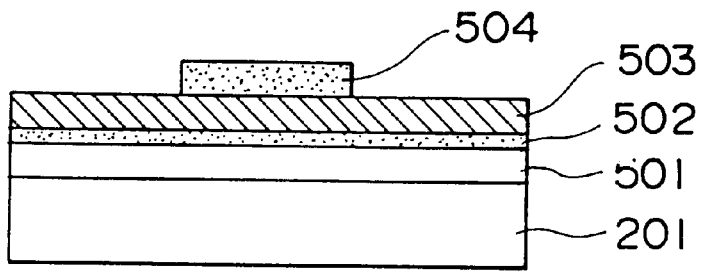

(3) Successively, as shown in FIG. 5(d), on the surface of this Nb film 503, an OFPR 800 having a thickness of 800 nm was applied as a positive photoresist mask 504, and the mask 504 was patterned into a microstrip line shape in accordance with photolithography.

Figure 5E:
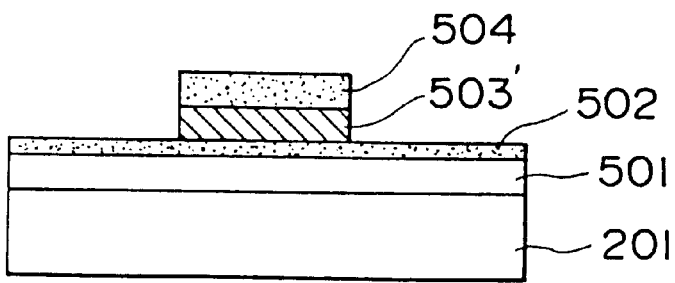

(4) Further, as shown in FIG. 5(e), only the Nb film 503 was processed by RIE (reactive ion etching) by use of this photoresist mask 504, to form a Nb film pattern 503'. In this case, $CF_4$ was used as the etching gas, and the plasma pressure was 0.3 Torr.

Figure 7:
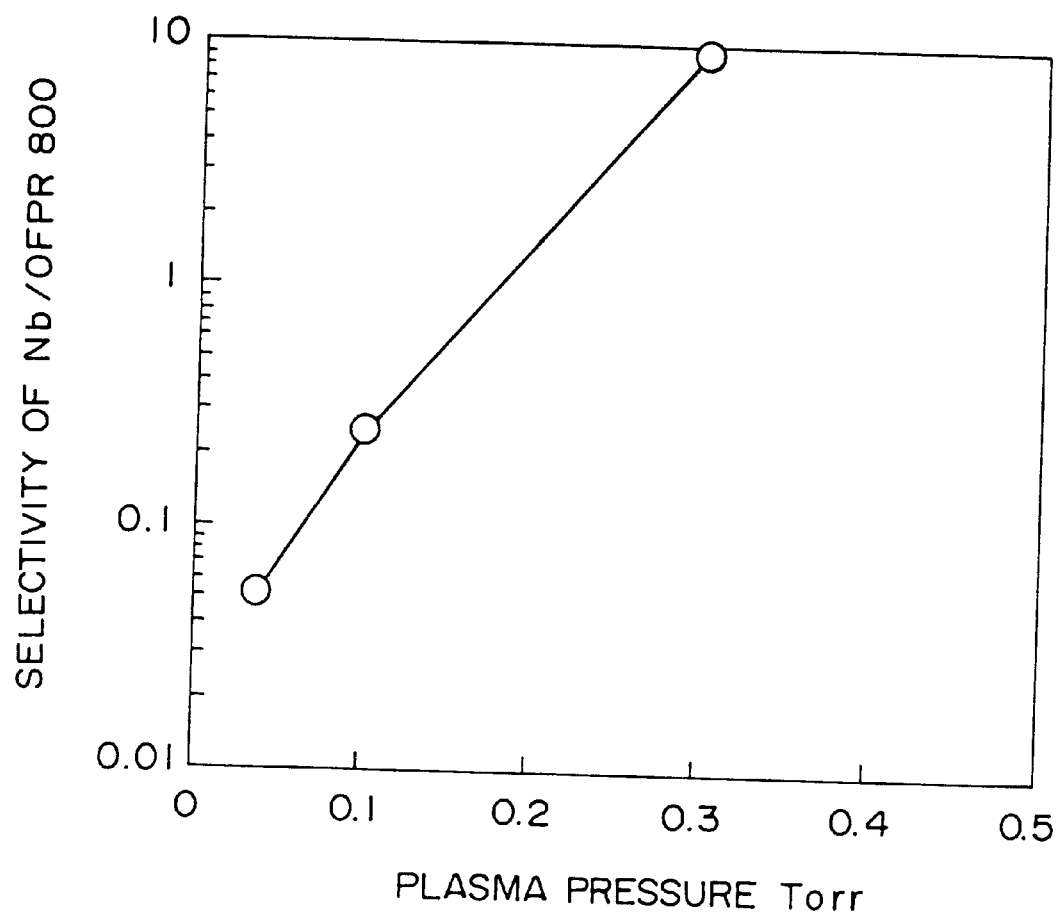
FIG. 7 is a graphical representation showing the relationship between the plasma pressure and the etching selectivity in the etching process shown in FIG. 5(e)

FIG. 7 shows the relationship between the etching selectivity and the plasma pressure. FIG. 7 indicates that when the plasma pressure is low, since the etching rate of the Nb film 503 relative to the etching rate of the photoresist mask 504 decreases, it is impossible to expect an excellent selective etching. In contrast with this, when the plasma pressure is 0.3 Torr or higher, an excellent selective etching can be realized.

Figure 6A:
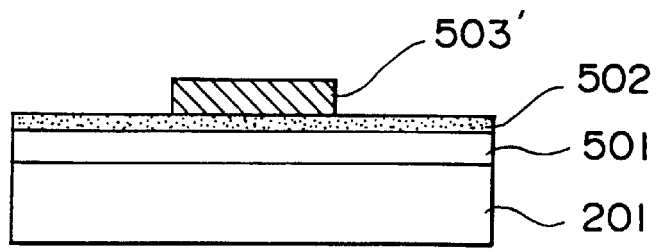
FIGS. 6(a) to 6(d) are cross-sectional views for assistance in explaining the second embodiment of the manufacturing method according to the present invention.

(5) After the Nb film 503 had been etched, as shown in FIG. 6(a), the positive photoresist mask 504 was removed by ashing.

Figure 6B:
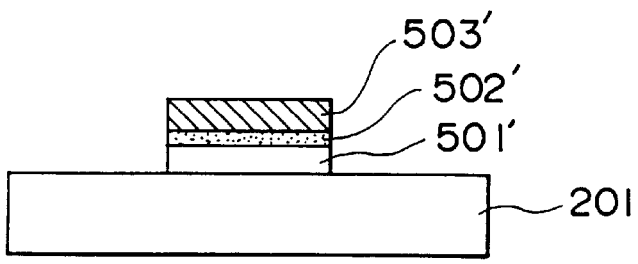

(6) Successively, as shown in FIG. 6(b), the substrate 201 was carried into plasma etching instrument as shown in FIG. 1. After the substrate 201 had been cooled to 6° C., the substrate 201 was plasma-etched by using the patterned Nb film 503' as a mask, to form the Au film and the YBCO film patterns 501' and 502'. In this case, as the plasma, an argon-oxygen mixed plasma having the oxygen mixture ratio of 10% was used. Further, the etching conditions were as follows: the plasma pressure was 0.7 mTorr; the ion acceleration voltage was 200 V; and the ion current density was 1.0 mA/cm².

Figure 6C:
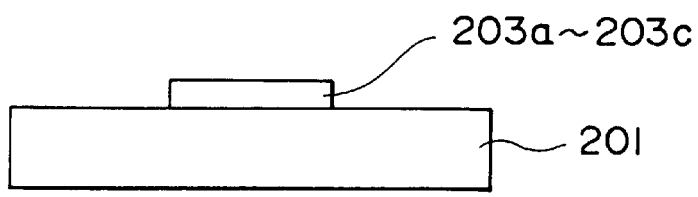

(7) Further, as shown in FIG. 6(c), after etching, the substrate 201 was heated up to a room temperature, and then carried out of the plasma etching instrument. Further, the Nb film 503' remaining on the substrate 201 was removed by the reactive ion etching. Further, the Au' film 502' remaining on the substrate 201 was removed by sputtering. Thus, the YBCO films 203a, 203b, and 203c were obtained.

Figure 6D:
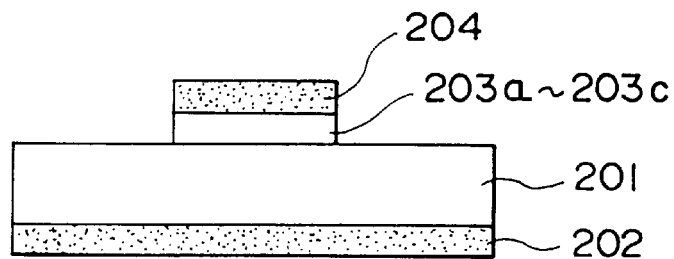

(8) Finally, as shown in FIG. 6(d), the two Au electrodes 204 having a thickness of 2 μm were formed on the surfaces of the two YBCO films 203a and 203c in accordance with an ordinary sputtering technique, and further the Au ground plane 202 having a thickness of 3 μm was formed on the lower surface of the substrate 201, thus completing the manufacturing process.

Figure 8:
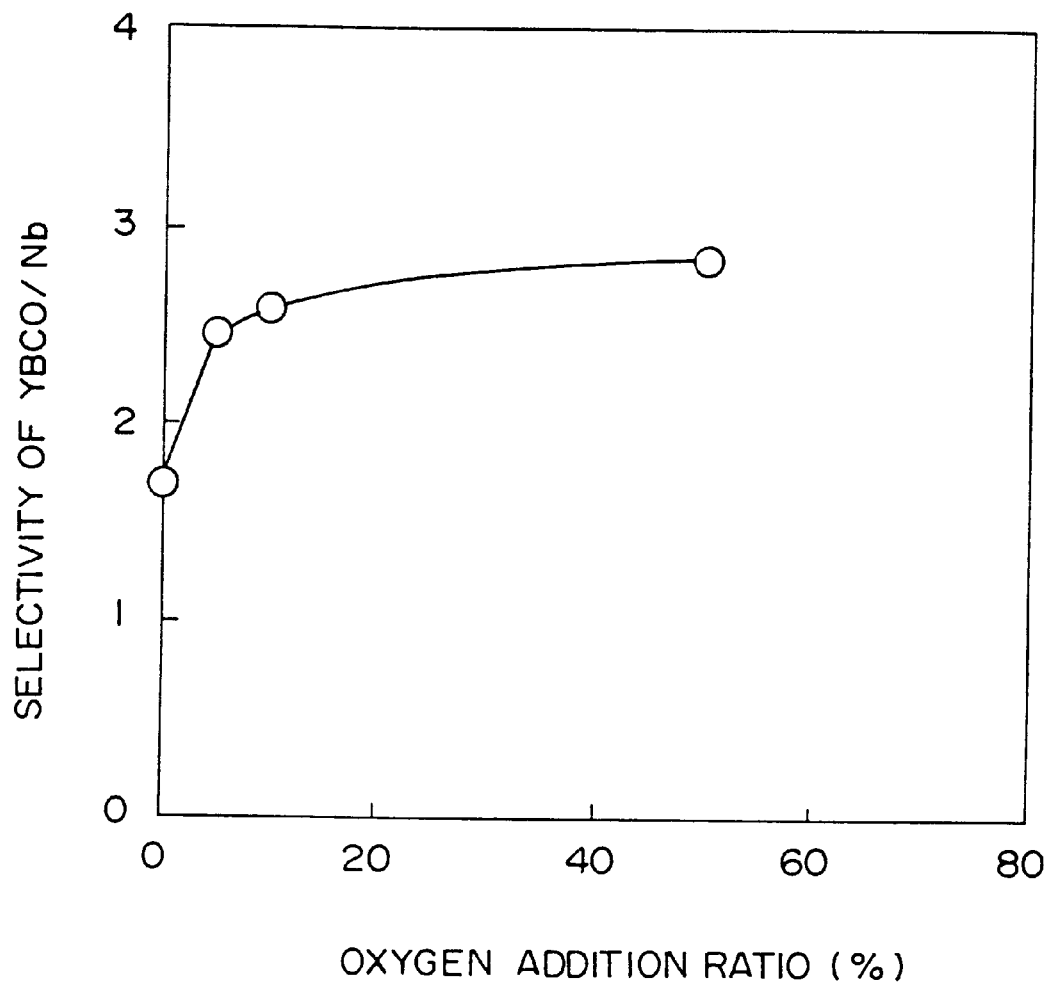
FIG. 8 is a graphical representation showing the relationship between the oxygen mixture ratio of plasma and the etching selectivity in the etching process shown in FIG. 6(b)

As described above, when the resonator 200 is manufactured by use of the plasma having an oxygen mixture ratio more than 5%, it is desirable to use a metallic mask (the Nb mask 503 in this embodiment). FIG. 8 shows the relationship between the oxygen mixture ratio of the plasma and the etching selectivity when the Nb film 503 is used as a mask. FIG. 8 indicates that the greater is the plasma oxygen mixture ratio of the plasma, the higher will be the etching selectivity. This is because when the plasma oxygen mixture ratio increases, since the surface of the Nb film 503 is oxidized, the etching rate decreases.

Here, the evaluation of the resonance characteristics of the microstrip line resonator 200 manufactured as described above will be explained hereinbelow.

Figure 9:
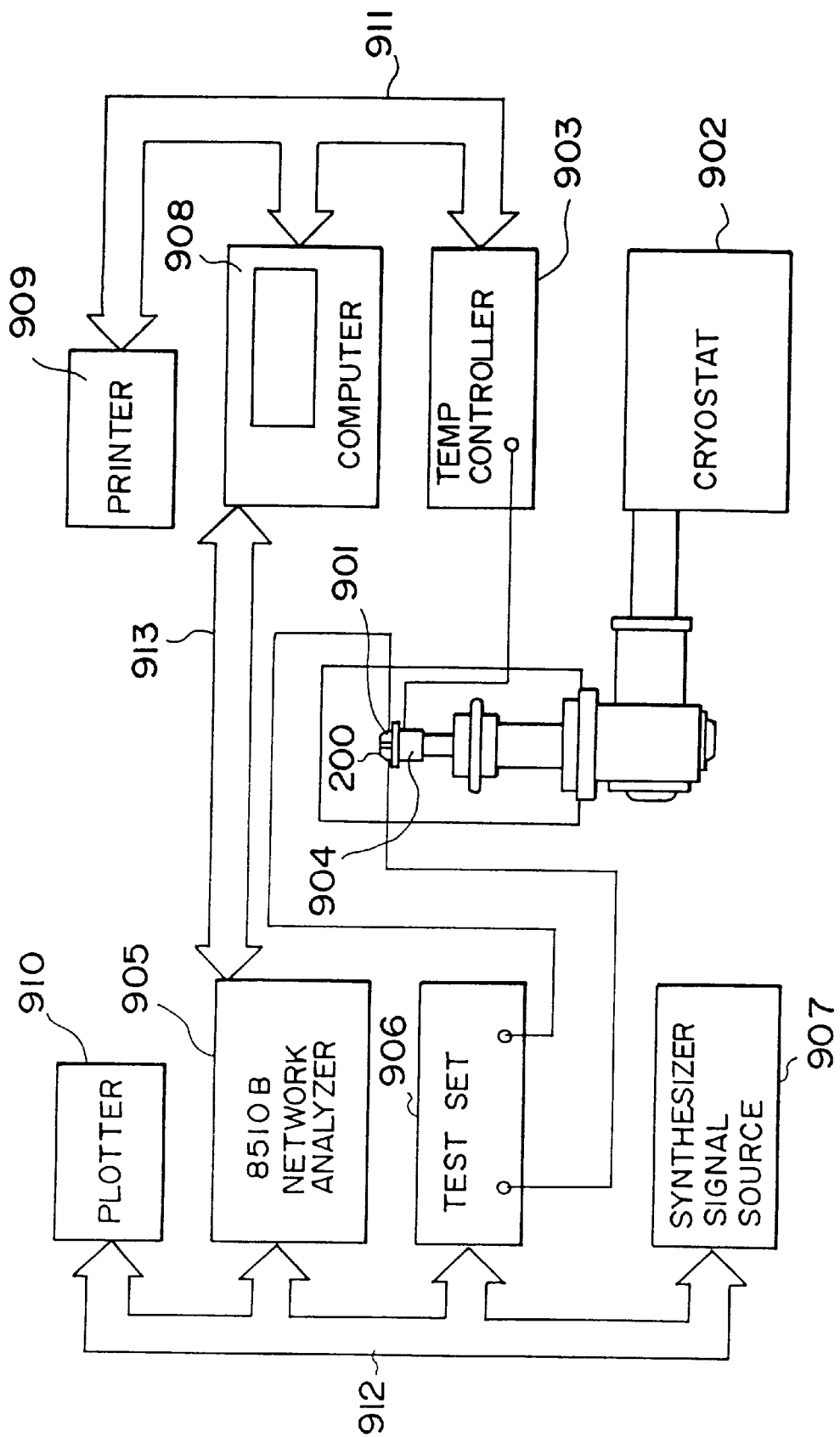
FIG. 9 is a conceptual block diagram showing a measurement system used to evaluate the characteristic of the superconductive device.

FIG. 9 is a conceptual block diagram showing a measurement system used to evaluate the resonance characteristics of the resonator 200 manufactured as described above.

In FIG. 9, a package-mounted resonator 200 is mounted on a sample holder 901. A cryostat 902 is used to cool the resonator 200 to 20 K. A temperature controller 903 heats the resonator 200 by use of a heater 904 to a predetermined temperature. In other words, the temperature of the resonator 200 can be controlled by being cooled by the cryostat 902 and heated by the heater 904. A network analyzer 905 and a test set 906 actually measure the resonator 200. Further, a synthesizer signal source 907 outputs and transmits microwave signals to various circuits. A computer 908 manages the temperature control and the measurement operation systematically. A printer 909 is used to print the temperature control status controlled by the temperature controller 903, for instance. Further, a plotter 910 is used to print the measurement results of the network analyzer 905. Further, the respective sections are connected to one another via GP-IB interfaces 911 to 913.

In this embodiment, the transmission characteristics $S_{21}$ of the resonator 200 were measured in a temperature range from 20 to 90 K by use of the measurement system as described above. Further, the dependency of the Q value under unloaded condition upon the temperature was examined on the basis of the measurement results.

Figure 10:
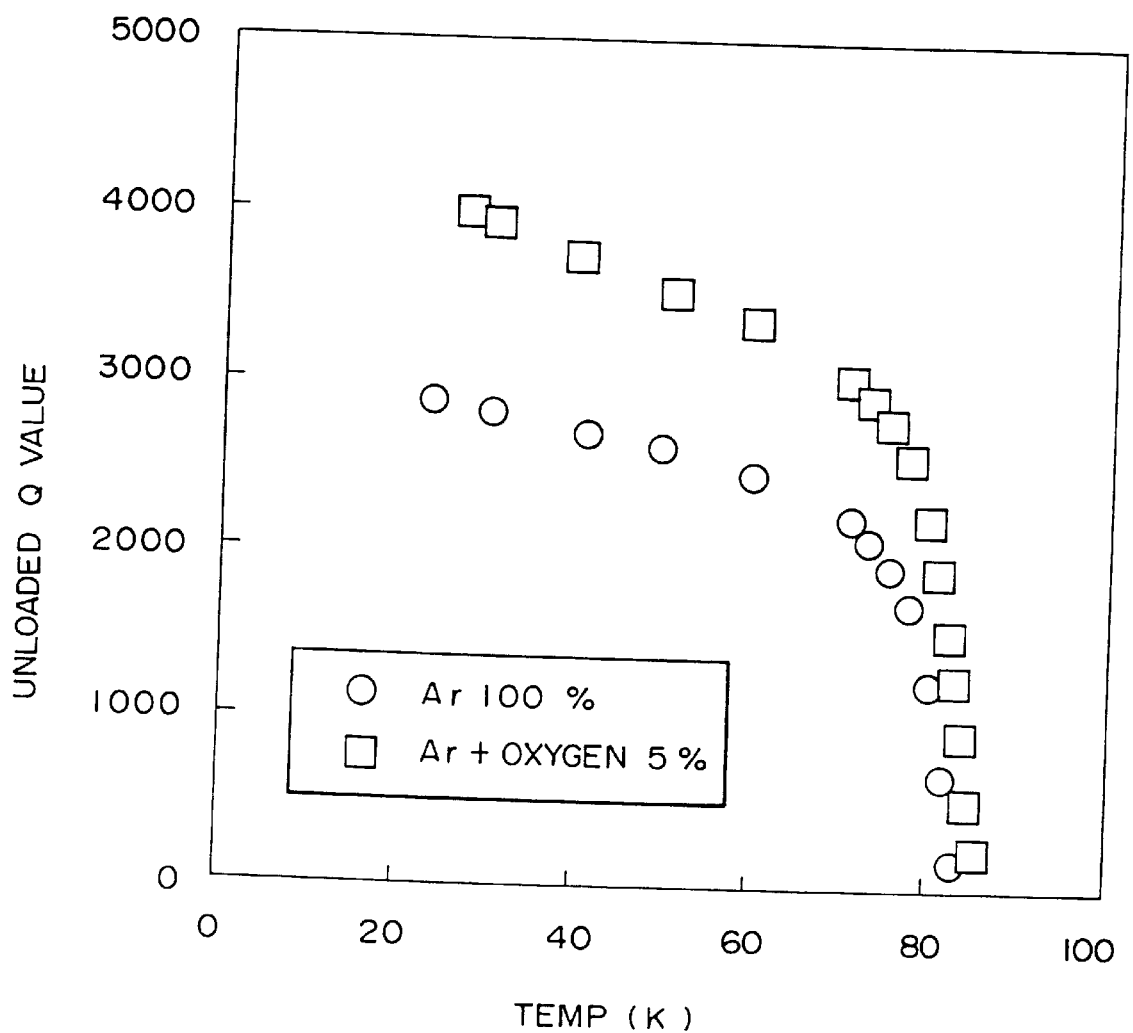
FIG. 10 is a graphical representation showing the dependency of the unloaded Q value upon the temperature in the superconductive device according to the first embodiment.
Figure 11:
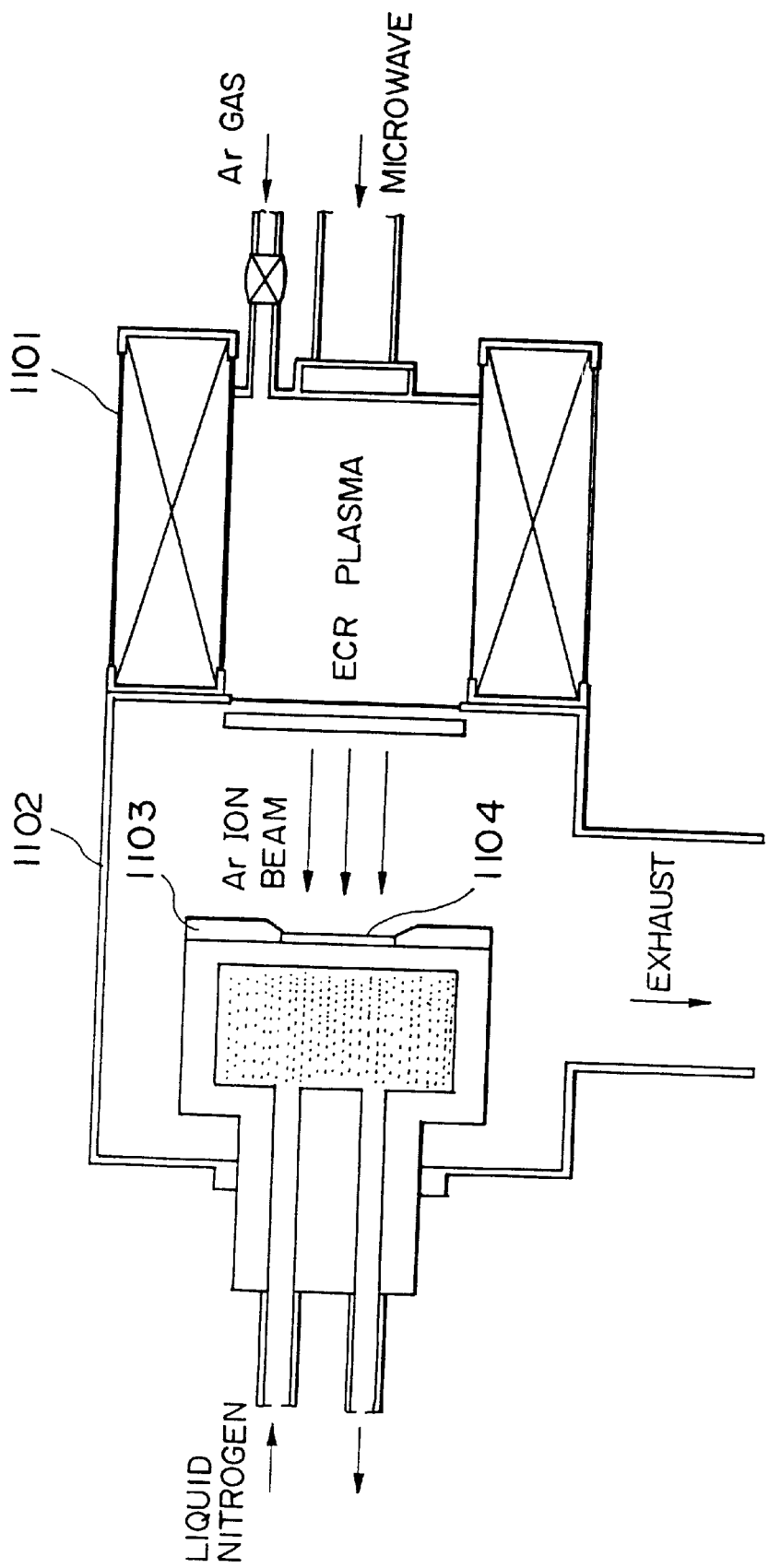
FIG. 11 is a cross-sectional view showing an etching instrument used for a prior art superconductive device manufacturing method.
Figure 12:
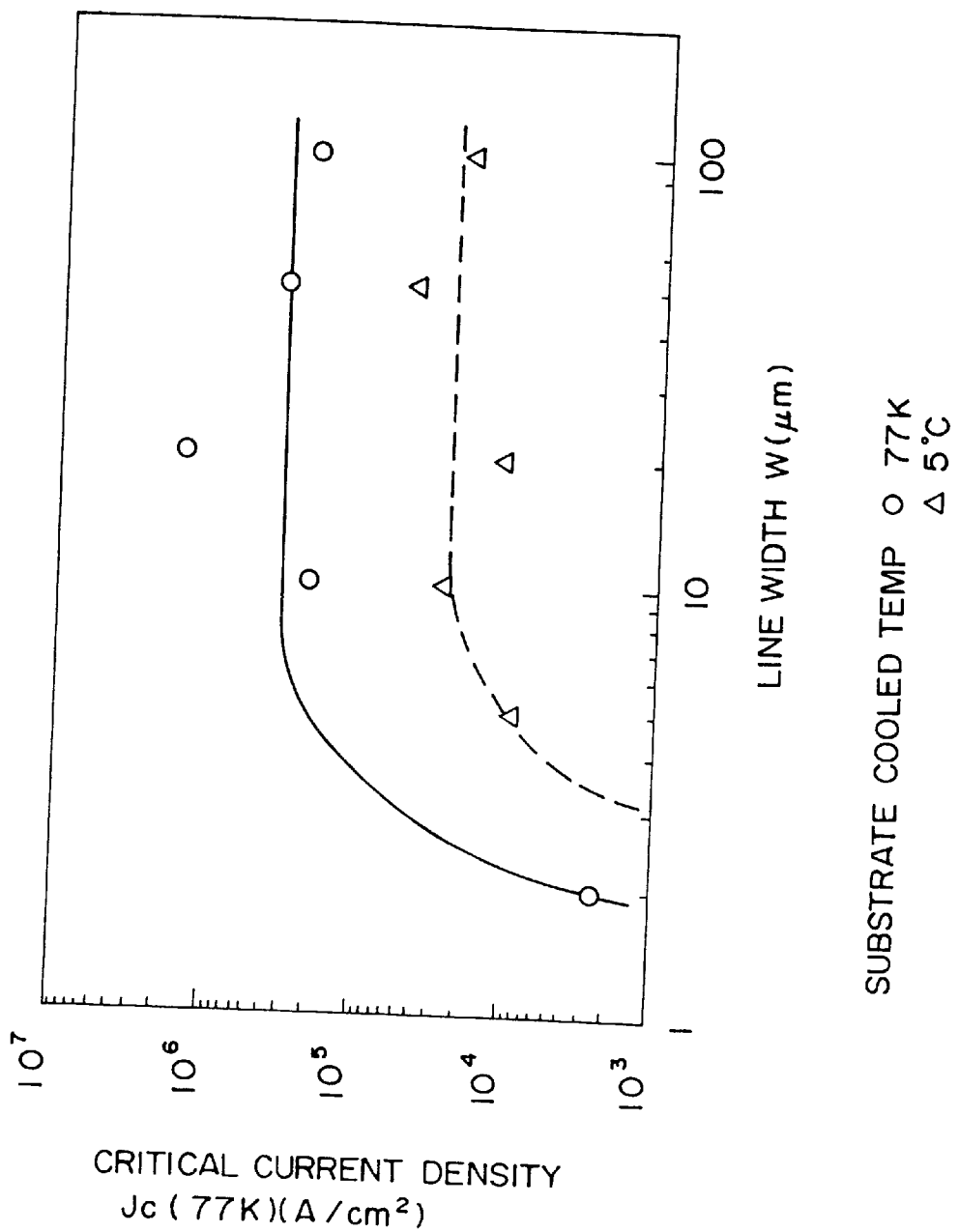
FIG. 12 is a graphical representation for assistance in explaining the superconductivity characteristics of the superconductive device manufactured by the prior art method.
Figure 13:
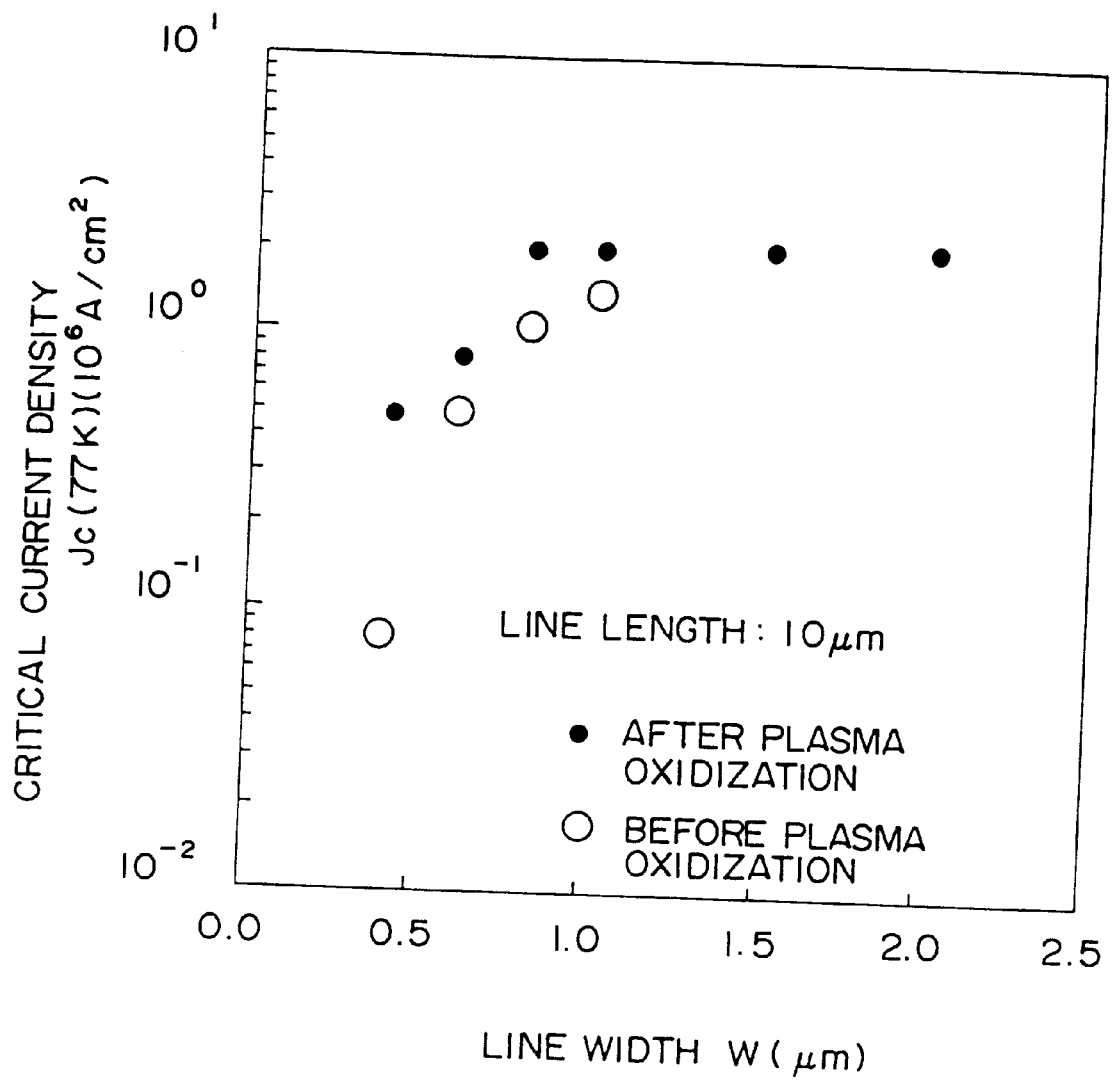
FIG. 13 is another graphical representation for assistance in explaining the superconductivity characteristics of the superconductive device manufactured by the prior art method.
Figure 14:
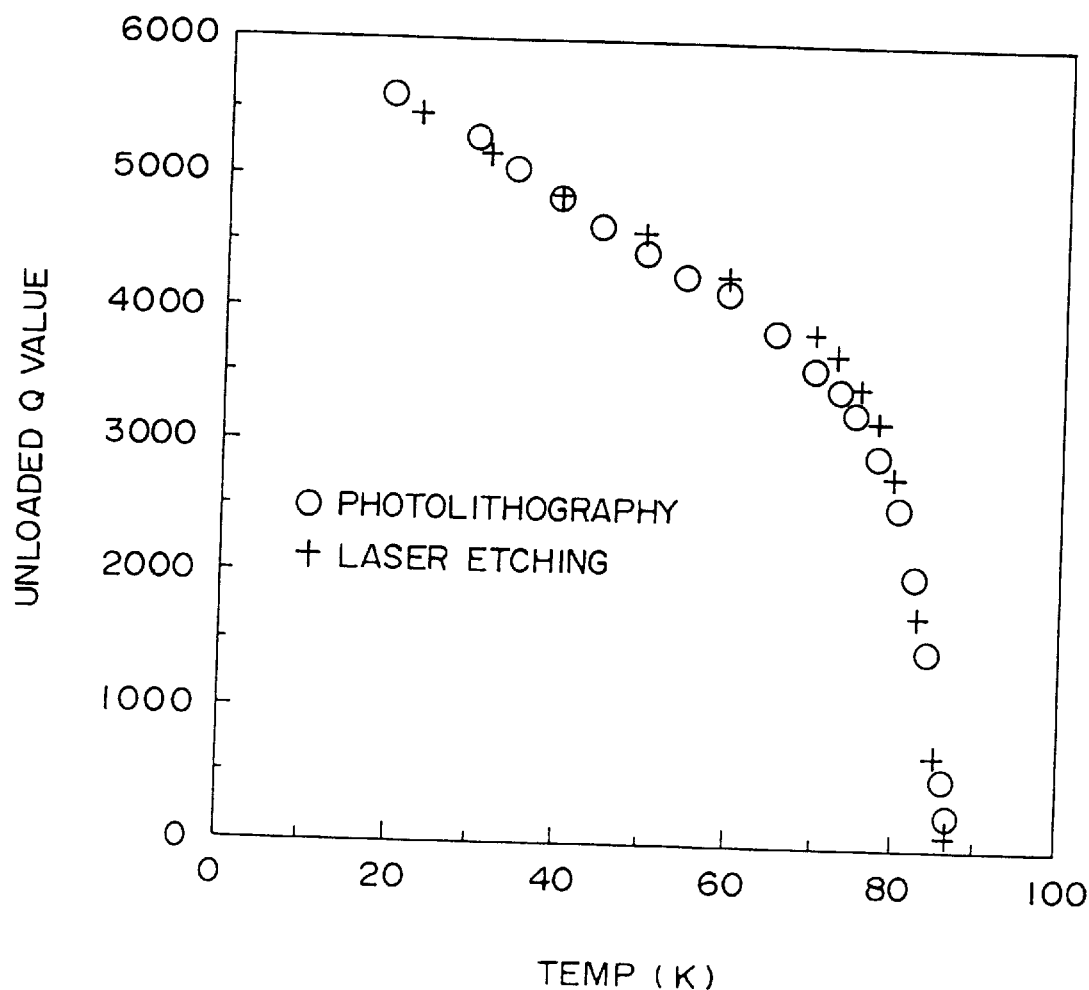
FIG. 14 is the other graphical representation for assistance in explaining the superconductivity characteristics of the superconductive device manufactured by the prior art method.

FIG. 10 shows the dependency of the unloaded Q value upon the temperature obtained as described above. In FIG. 10, the square marks denote the dependency of the unloaded Q value upon the temperature of the resonator 200 manufactured in accordance with the first embodiment method shown in FIGS. 3(a) to 3(e) (the argon-oxygen mixed plasma having an oxygen mixture ratio less than 5% was used for etching). On the other hand, the circular marks denote the dependency of the unloaded Q value upon the temperature of the resonator 200 manufactured in accordance with the prior art manufacturing method (the plasma of 100% argon was used for etching), for comparison of the method according to the present invention with the prior art method. FIG. 10 indicates that the unloaded Q values (the square marks) of the resonator manufactured in accordance with the method according to the present invention are higher than those (the circular marks) of the resonator manufactured in accordance with the prior art method. In other words, in the method according to the present invention, it is possible to manufacture the resonator 200 of excellent superconductivity characteristics.

As described above, in the manufacturing method of the superconductive device according to the present invention, since the plasma (including the oxygen plasma) is used for the etching process, it is possible to perform the etching, while suppressing the desorption of oxygen from the etched surface, with the result that the superconductive device of excellent superconductivity characteristics can be obtained, as compared with the case of the prior devices manufactured in accordance with the prior art method.

Further, since the superconductive device of excellent characteristics can be manufactured without supplying oxygen after the etching process, it is possible to shorten the manufacturing process.

Further, it is possible to prevent the melted YBCO from being laminated on the etched surface so far involved in the prior art method.

In addition, since the etching process can be made in the substrate temperature range from 0 to −10° C., it is possible to markedly shorten the time required for the process of cooling the substrate before etching, or the process of heating the substrate to room temperature after etching.

Further, although the manufacturing method according to the present invention has been explained for the case of the resonator, it is of course possible to adopt the method according to the present invention to various other devices utilizing the superconductive film such as filters, Josephson junction devices, and the like.

As described above, in the manufacturing method according to the present invention, it is possible to provide a method of manufacturing superconductive devices which can prevent the superconductive characteristics from deteriorating in the processed surface, reduce the number of process steps, and shorten the manufacturing time.

What is claimed is:

1. A superconductive device manufacturing method, comprising the steps of:
    forming a superconductive film comprised of oxygen on a substrate;
    forming a mask pattern on the superconductive film; and
    etching the superconductive film using a plasma including at least oxygen plasma so as to prevent oxygen effusion from the superconductive film.

2. The superconductive device manufacturing method of claim 1, wherein the step of etching comprises maintaining the substrate temperature at between 0 and −10° C.

3. The superconductive device manufacturing method of claim 1, wherein the step of etching comprises using an ion acceleration voltage of 200 to 500 volt, and using an ion current density of 4mA/cm² or less.

4. The superconductive device manufacturing method of claim 1, wherein the step of etching comprises using as the plasma one of an argon-oxygen mixed plasma and an oxygen plasma.

5. The superconductive device manufacturing method of claim 1, wherein the step of forming a mask pattern comprises forming a photoresist on the superconductive film, and the step of etching comprises using a plasma having an oxygen mixture ratio of less than 5%.

6. The superconductive device manufacturing method of claim 1, wherein the step of forming a mask pattern comprises forming a mask pattern of a metal on the superconductive film, and the step of etching comprises using an oxygen mixture ratio of more than 5%.

7. The superconductive device manufacturing method of claim 1, wherein the superconductive film is comprised of YBCO.

8. A superconductive device manufacturing method, comprising the steps of:

forming a superconductive film comprised of YBCO on a substrate;

forming a mask pattern on the superconductive film; and etching the superconductive film using an oxygen-containing plasma comprised of an effective amount of oxygen to prevent effusion of oxygen from the superconductive film, the substrate being maintained at a temperature of from between 0 and −10° C. during etching.

9. The superconductive device manufacturing method of claim 8, wherein the step of etching comprises using an ion acceleration voltage of 200 to 500 volt, and using an ion current density of $4mA/cm^2$ or less.

10. The superconductive device manufacturing method of claim 8, wherein the step of etching comprises using as the plasma one of an argon-oxygen mixed plasma and an oxygen plasma.

11. The superconductive device manufacturing method of claim 8, wherein the step of forming a mask pattern comprises forming a photoresist on the superconductive film, and the step of etching comprises using a plasma having an oxygen mixture ratio of less than 5%.

12. The superconductive device manufacturing method of claim 8, wherein the step of forming a mask pattern comprises forming a mask pattern of a metal on the superconductive film, and the step of etching comprises using an oxygen mixture ratio of more than 5%.

13. The superconductive device manufacturing method of claim 8, wherein the superconductive device is selected from the group consisting of resonators, filters and Josephson junction devices.

* * * * *